United States Patent
Lindberg et al.

(10) Patent No.: US 10,602,183 B2
(45) Date of Patent: Mar. 24, 2020

(54) TECHNIQUES FOR COMPRESSING FLOATING-POINT FORMAT IMAGES

(71) Applicant: Apple Inc., Cupertino, CA (US)

(72) Inventors: Lars M. Lindberg, Bjaerred (SE); Ali Sazegari, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/035,545

(22) Filed: Jul. 13, 2018

(65) Prior Publication Data

US 2019/0373283 A1 Dec. 5, 2019

Related U.S. Application Data

(60) Provisional application No. 62/678,870, filed on May 31, 2018.

(51) Int. Cl.

| | |
|---|---|
| H04N 19/124 | (2014.01) |
| H04N 19/182 | (2014.01) |
| H04N 19/186 | (2014.01) |
| H04N 19/523 | (2014.01) |
| H03M 7/24 | (2006.01) |

(52) U.S. Cl.
CPC ............ H04N 19/523 (2014.11); H03M 7/24 (2013.01); H04N 19/124 (2014.11); H04N 19/182 (2014.11); H04N 19/186 (2014.11)

(58) Field of Classification Search
CPC .. H04N 19/124; H04N 19/182; H04N 19/186; H04N 19/523

USPC .......................... 375/240.12, 240.26, 240.29
See application file for complete search history.

(56) References Cited

U.S. PATENT DOCUMENTS

2006/0294312 A1\* 12/2006 Walmsley ............. H04L 9/0662
 711/122
2018/0176585 A1\* 6/2018 Kalevo ................ H04N 19/463

\* cited by examiner

*Primary Examiner* — Dominic D Saltarelli
(74) *Attorney, Agent, or Firm* — Dickinson Wright RLLP

(57) ABSTRACT

Disclosed herein are techniques for pre-processing a multiple-channel image for compression. The multiple-channel image can be composed of a collection of pixels that are represented using a floating-point format (e.g., half-precision/16-bit) for display on devices optimized for wide-gamut color space. The techniques can include a first step of quantizing the pixels into a fixed range of values, and applying invertible color-space transformations to the sub-pixels of each pixel—which can include red, green, blue, and alpha sub-pixels—to produce transformed sub-pixels including luma and chroma values. Next, the luma sub-pixels are placed into a luma data stream, the first and second chroma values are placed into a chroma data stream, and the alpha sub-pixels are placed into an alpha data stream. Predictive functions are then applied to the luma and chroma data streams. Finally, the various streams are separated into buffers and compressed to produce a multiple-channel image.

20 Claims, 12 Drawing Sheets

Step 220 – Apply the following invertible color space transformation functions to each R,G,B sub-pixel to produce transformed sub-pixels:

Step 230 – Apply the following quantizations to each Co, Cg sub-pixel to produce transformed sub-pixels:

$$\text{Co} = \text{Co} / 2^Y$$
$$\text{Cg} = \text{Cg} / 2^Y$$

Quantizations 232

Transformed Sub-Pixels 224 (upper table)

Transformed Sub-Pixels 234 (lower table)

Step 250 – Separate the multiple-channel image into two or more sub-images (i.e., "tiles").

Step 260 – Apply different predictive functions to each row of Y, Co, and Cg sub-pixels to identify a predictive function that yields the best prediction differentials across the row.

Transformed Sub-Pixels 234 → Predicted Sub-Pixels 262

Example: Applying different predictive functions to the second row of the Y sub-pixels:

Step 270 – For each row of pixels, store the index for the predictive function that yields the lowest overall prediction differential across the row.

TECHNIQUES FOR COMPRESSING FLOATING-POINT FORMAT IMAGES

CROSS-REFERENCE TO RELATED APPLICATIONS

The present application claims the benefit of U.S. Provisional Application No. 62/678,870, entitled "TECHNIQUES FOR COMPRESSING FLOATING-POINT FORMAT IMAGES," filed May 31, 2018, the content of which is incorporated herein by reference in its entirety for all purposes.

FIELD OF INVENTION

The embodiments described herein set forth techniques for compressing floating-point format images that implement a wide-gamut color space. In particular, the techniques involve pre-processing the images (i.e., prior to compression) in a manner that can enhance resulting compression ratios and decompression efficiency when subsequently displayed using hardware/software that is optimized for implementing the wide-gamut color space.

BACKGROUND

Image compression techniques involve exploiting aspects of an image to reduce its overall size while retaining information that can be used to re-establish the image to its original (lossless) or near-original (lossy) form. Different parameters can be provided to compressors to achieve performance characteristics that best-fit particular environments. For example, higher compression ratios can be used to increase the amount of available storage space within computing devices (e.g., smart phones, tablets, wearables, etc.), but this typically comes at a cost of cycle-intensive compression/decompression procedures that consume correspondingly higher amounts of power and time. On the contrary, cycle-efficient compression techniques can reduce power consumption and latency, but this typically comes at a cost of correspondingly lower compression ratios and amounts of available storage space within computing devices.

Notably, new compression challenges are arising as computing device capabilities are enhanced over time. For example, computing devices can be configured (e.g., at a time of manufacture) to store thousands of images that are frequently-accessed by users of the computing devices. For example, a collection of user interface elements (i.e., images) can be stored at a given computing device, where it can be desirable to enable the collection of images to be frequently-accessed with low computational overhead. Additionally, although average storage space availability is also being increased over time, it can still be desirable to reduce a size of the collection to increase the average storage space availability.

SUMMARY OF INVENTION

Representative embodiments set forth herein disclose techniques for compressing floating-point format multiple-channel images—e.g., red, green, blue, and alpha (RGBA) images—that implement a wide-gamut color space. In particular, the techniques involve pre-processing the images (i.e., prior to compression) in a manner that can enhance resulting compression ratios when the images are compressed using lossless compressors.

One embodiment sets forth a method for pre-processing a floating-point format multiple-channel image for compression. According to some embodiments, the method can be implemented at a computing device, and include a first step of receiving the multiple-channel image, where the multiple-channel image is composed of a plurality of pixels, and each pixel of the plurality of pixels is composed of sub-pixels that include: a red sub-pixel, a green sub-pixel, a blue sub-pixel, and an alpha sub-pixel. A next step can include performing the following procedures for each pixel of the plurality of pixels: (i) quantizing the pixel into a fixed range of values, and (ii) applying invertible color-space transformations to the sub-pixels of the pixel to produce transformed sub-pixels that include a luma sub-pixel, a first chroma sub-pixel, and a second chroma sub-pixel. A next step can include separating (i) all luma sub-pixels into a luma data stream, (ii) all first and second chroma values into a chroma data stream, and (iii) all alpha sub-pixels into an alpha data stream. Subsequent steps can include applying predictive functions to the luma data stream and the chroma data stream, and establishing a least significant byte (LSB) and a most significant byte (MSB) data stream. An additional step can include, for each pixel of the plurality of pixels in the luma or chroma data streams: separating the pixels into the LSB and MSB data streams. A final step can include compressing the alpha, LSB, and MSB data streams to produce a compressed multiple-channel image.

Other embodiments include a non-transitory computer readable storage medium configured to store instructions that, when executed by a processor included in a computing device, cause the computing device to carry out the various steps of any of the foregoing methods. Further embodiments include a computing device that is configured to carry out the various steps of any of the foregoing methods.

Other aspects and advantages of the invention will become apparent from the following detailed description taken in conjunction with the accompanying drawings that illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments can be practiced without some or all of these specific details. In other instances, well-known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments can be used, and changes can be made without departing from the spirit and scope of the described embodiments.

Representative embodiments set forth herein disclose techniques for compressing floating-point format multiple-channel images (e.g., red, green, blue, and alpha (RGBA) images) that implement a wide-gamut color space. In particular, the techniques involve pre-processing the images (i.e., prior to compression) in a manner that can enhance resulting compression ratios when the images are compressed using lossless compressors.

Figure 1:
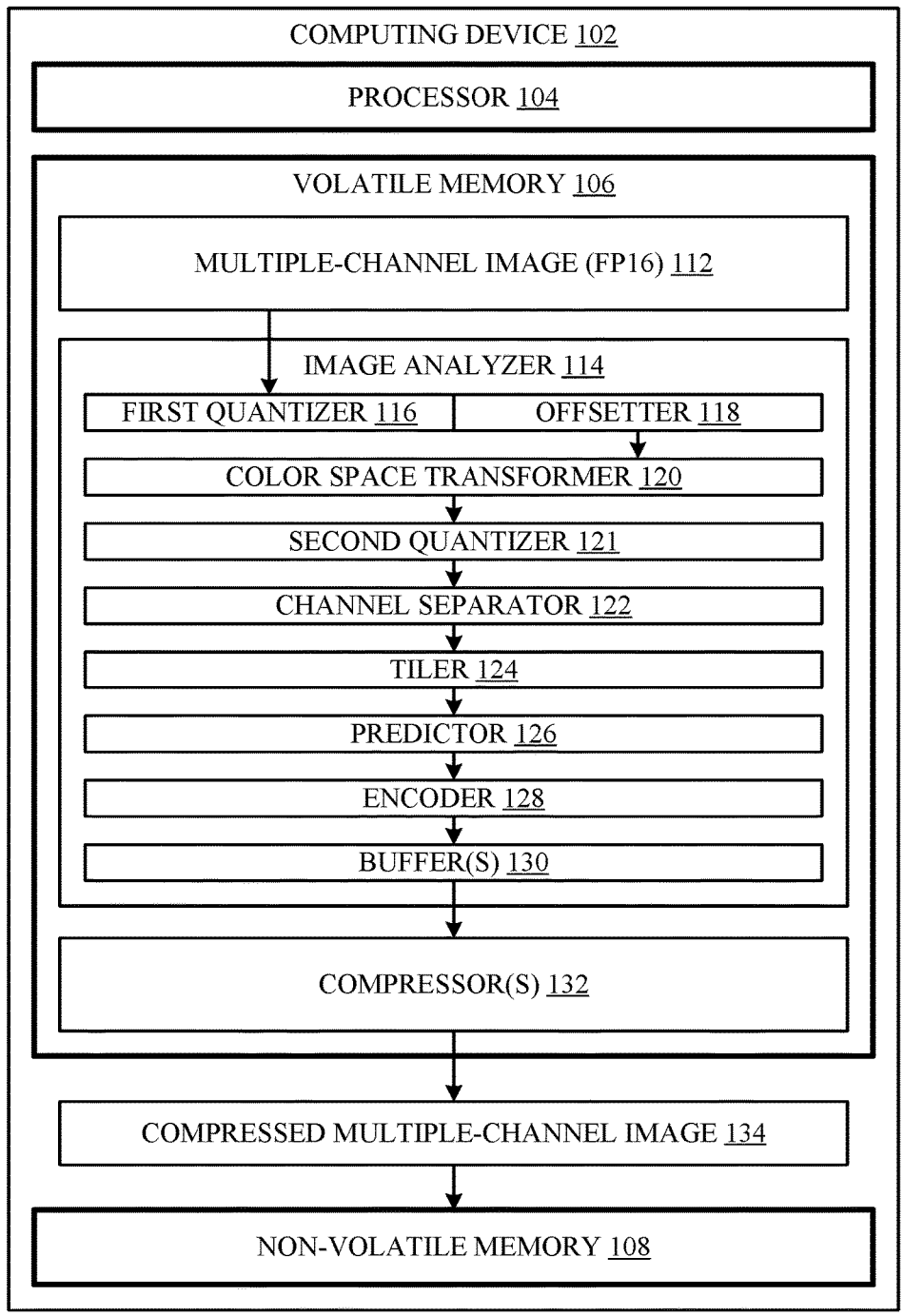
FIG. 1 illustrates an overview of a computing device that can be configured to perform the various techniques described herein, according to some embodiments.
Figure 4:
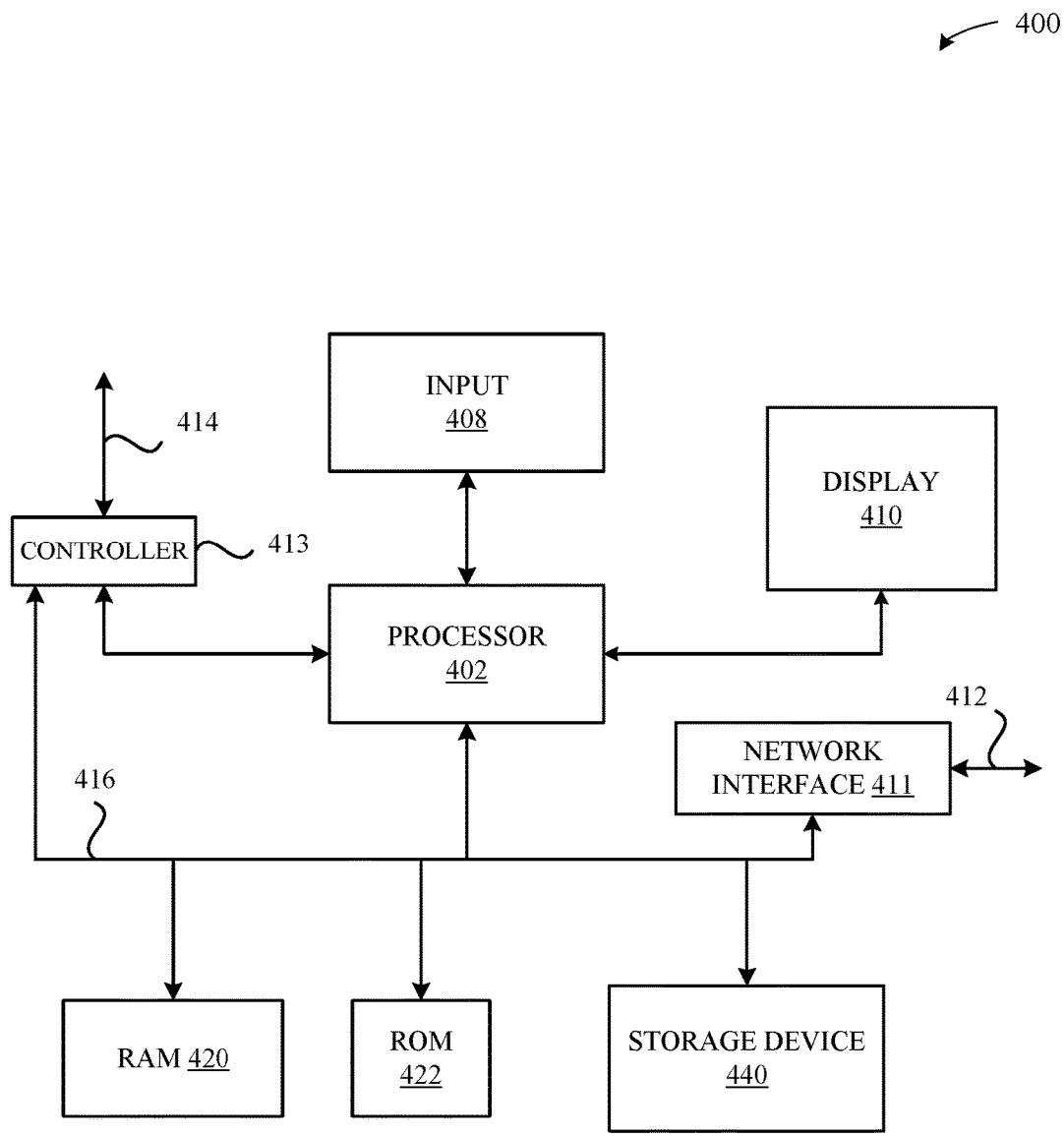
FIG. 4 illustrates a detailed view of a computing device that can be used to implement the various techniques described herein, according to some embodiments.

FIG. 1 illustrates an overview 100 of a computing device 102 that can be configured to perform the various techniques described herein. As shown in FIG. 1, the computing device 102 can include a processor 104, a volatile memory 106, and a non-volatile memory 108. It is noted that a more detailed breakdown of example hardware components that can be included in the computing device 102 is illustrated in FIG. 4, and that these components are omitted from the illustration of FIG. 1 merely for simplification purposes. For example, the computing device 102 can include additional non-volatile memories (e.g., solid state drives, hard drives, etc.), other processors (e.g., one or more single or multi-core central processing unit (CPUs), one or more single or multi-core graphics processing units (GPUs)), and so on. According to some embodiments, an operating system (OS) can be loaded into the volatile memory 106, where the OS can execute a variety of applications that collectively enable the various techniques described herein to be implemented. For example, these applications can include an image analyzer 114 (and its internal components), one or more compressors 132, and so on.

In some embodiments, the various hardware/software components of the computing device 102 can be configured to implement a wide-gamut color space that expands on the standard Red/Green/Blue (sRGB) color space commonly implemented on traditional computing devices. For example, the computing device 102 can include one or more display devices (e.g., liquid crystal displays (LCDs), organic light-emitting diode displays (OLEDs), etc.) that are capable of displaying colors that span the range of the wide-gamut color space. Moreover, the computing device 102 can include processors (e.g., CPUs, GPUs, etc.) and/or software configured to implement the wide-gamut color space in an optimized manner. In one example, the computing device 102 can be configured to implement the "Display P3" technology by Apple®, which is based on a 16-bit integer per sub-pixel approach, i.e., where each sub-pixel (of a given pixel) is assigned an integer value that ranges from [0 to 65535]. In some cases, each sub-pixel can instead be assigned a floating-point value that corresponds to the integer value. In particular, each sub-pixel can take on a fraction-based value that is small relative to the integer values that normally are assigned to sub-pixels. For example, a given sub-pixel that implements the wide-gamut color space in floating-point format can take on a floating-point value that ranges from [0.0 to 1.0] when the sub-pixel is assigned a color value that is a member of the sRGB color space. Continuing with this example, the sub-pixel can take on a floating-point value that ranges from [−0.75 to 1.25] when the sub-pixel is assigned a color value that is a member of the wide-gamut color space, where the negative values are encoded as the signed reflection of the original encoding function: $y(x)=\text{sign}(x)*f(\text{abs}(x))$. In this regard, it is noted that traditional image compression techniques that target integer-based images are not efficient at compressing floating-point format images given their stark differences.

Accordingly, the image analyzer 114 can be configured to implement techniques that involve pre-processing floating-point format multiple-channel images 112 prior to compressing them to optimize the overall compression ratios that can be ultimately achieved. In the interest of simplifying this disclosure, the various techniques set forth herein discuss multiple-channel images 112 that include red, green, blue, and alpha sub-pixels (also referred to herein as "channels"). However, it is noted that the techniques described herein can be applied to any multiple-channel image 112 where compression enhancements can be afforded without departing from the scope of this disclosure. For example, the techniques can be applied to multiple-channel images 112 having different resolutions, layouts, bit-lengths, and so on (compared to those described herein) without departing from the scope of this disclosure. It is noted that FIGS. 2A-2H and 3A-3B (and the corresponding descriptions set forth below) provide a more detailed breakdown of the functionality of the image analyzer 114, and that the following description of the image analyzer 114 with respect to FIG. 1 is provided at a high level in the interest of simplifying this disclosure.

As shown in FIG. 1, the multiple-channel image 112 is received by the image analyzer 114. According to some embodiments, and as described in greater detail herein, the multiple-channel image 112 can be composed of a collection of pixels, where each pixel in the collection of pixels includes a red sub-pixel, a green sub-pixel, a blue sub-pixel, an alpha sub-pixel. As described herein, the multiple-channel image 112 can be received in a floating-point format, where each sub-pixel is represented by a floating-point value. For example, each sub-pixel can be represented using a 16-bit base two (2) format—referred to herein as "FP16"—such that each pixel is composed of a total of sixty-four (64) bits (i.e., sixteen (16) bits for the red sub-pixel, sixteen (16) bits for the green sub-pixel, sixteen (16) bits for the blue sub-pixel, and sixteen (16) bits for the alpha channel). It is noted that the discussion of FP16 throughout this disclosure is exemplary, and that the multiple-channel image 112 can be configured in accordance with any floating-point format without departing from the scope of this disclosure. Additionally, it is noted that the multiple-channel image 112 can be obtained by converting any RGBA image into the FP16 format described herein. For example, a 16-bit integer format RGBA image can be converted into a 16-bit floating-point format RGBA image using known techniques. In another example, a 32-bit format RGBA image can be converted into a 16-bit floating-point format RGBA image using known techniques. It is noted that the foregoing scenarios are exemplary, and that any image—with any number of channels and in any format can be converted to produce a floating-point format image to be processed by the image analyzer 114 in accordance with the techniques set forth herein.

In any case, upon receipt of the multiple-channel image 112, the image analyzer 114 can be configured to provide the multiple-channel image 112 to a first quantizer 116 and an offsetter 118. According to some embodiments, the first quantizer 116 can be configured to quantize the pixels of the multiple-channel image 112, which is described below in greater detail in conjunction with FIG. 2A. Next, an offsetter 118 can be configured to work in conjunction with the first quantizer 116 to establish an offset to be added to the quantized sub-pixels to account for the fact that the distribution of the color values of the multiple-channel image 112 typically is not uniform, which is described below in greater detail in conjunction with FIG. 2A.

Next, the multiple-channel image 112 can be provided to a color space transformer 120, a second quantizer 121, and a channel separator 122, which perform a series of additional operations on the multiple-channel image 112 prior to compressing the multiple-channel image 112. In particular, the color space transformer 120 can be configured to apply an invertible color space transformation to the sub-pixels of each pixel of the multiple-channel image 112, which is described below in greater detail in conjunction with FIG. 2B. Next, the second quantizer 121 can further-quantize the sub-pixels of each pixel of the multiple-channel image 112, which is described below in greater detail in conjunction with FIG. 2C. Next, the channel separator 122 can be configured to separate the sub-pixels of each pixel of the multiple-channel image 112 into various data streams, which is described below in greater detail in conjunction with FIG. 2D.

Additionally, the multiple-channel image 112 can be provided to a tiler 124, a predictor 126, and an encoder 128, which perform a series of additional operations on the multiple-channel image 112 prior to compressing the multiple-channel image 112. In particular, the tiler 124 can be configured to separate the multiple-channel image 112 into two or more "tiles" (i.e., sub-images of the multiple-channel image 112) to enable each tile to be separately streamed from memory when compressing or decompressing (at a later time) the multiple-channel image 112. A more detailed description of the manner in which the tiler 124 operates is provided below in conjunction with FIG. 2E. Next, the predictor 126 can identify a predictive function (e.g., from among a group of available predictive functions) that yields the most desirable (e.g., the most accurate) prediction results for each row of the pixels of the multiple-channel image 112, which is described below in greater detail in conjunction with FIGS. 2F-2G. Subsequently, the encoder 128 can process the various data streams into which the multiple-channel image 112 and provide them to buffer(s) 130, which is described below in greater detail in conjunction with FIG. 2H. In turn, the compressor(s) 132 can take action and compress the buffer(s) 130, which is also described below in greater detail in conjunction with FIG. 2H. Finally, the output(s) of the compressor(s) 132 can be joined together to produce a compressed multiple-channel image 134, which is also described below in greater detail in conjunction with FIG. 2H.

According to some embodiments, the compressor(s) 132 can be configured to implement one or more compression techniques for compressing the buffer(s) 130. For example, the compressors 132 can implement Lempel—Ziv (LZ)-based compressors—e.g., Lempel-Ziv+Finite State Entropy (LZFSE), LZVN, LZ4 compressor, etc.—other types of compressors, combinations of compressors, and so on. Moreover, the compressor(s) 132 can be implemented in any manner to establish an environment that is most-efficient for compressing the buffer(s) 130. For example, multiple buffers 130 can be instantiated (where pixels of the multiple-channel image 112 can be pre-processed in parallel), and each buffer 130 can be tied to a respective compressor 132 such that the buffers 130 can be simultaneously compressed in parallel as well. Moreover, the same or a different type of compressor 132 can be tied to each of the buffer(s) 130 based on the formatting of the data that is placed into the buffer(s) 130.

Accordingly, FIG. 1 provides a high-level overview of different hardware/software architectures that can be implemented by computing device 102 in order to carry out the various techniques described herein. A more detailed breakdown of these techniques will now be provided below in conjunction with FIGS. 2A-2H and 3A-3B.

Figure 2A:
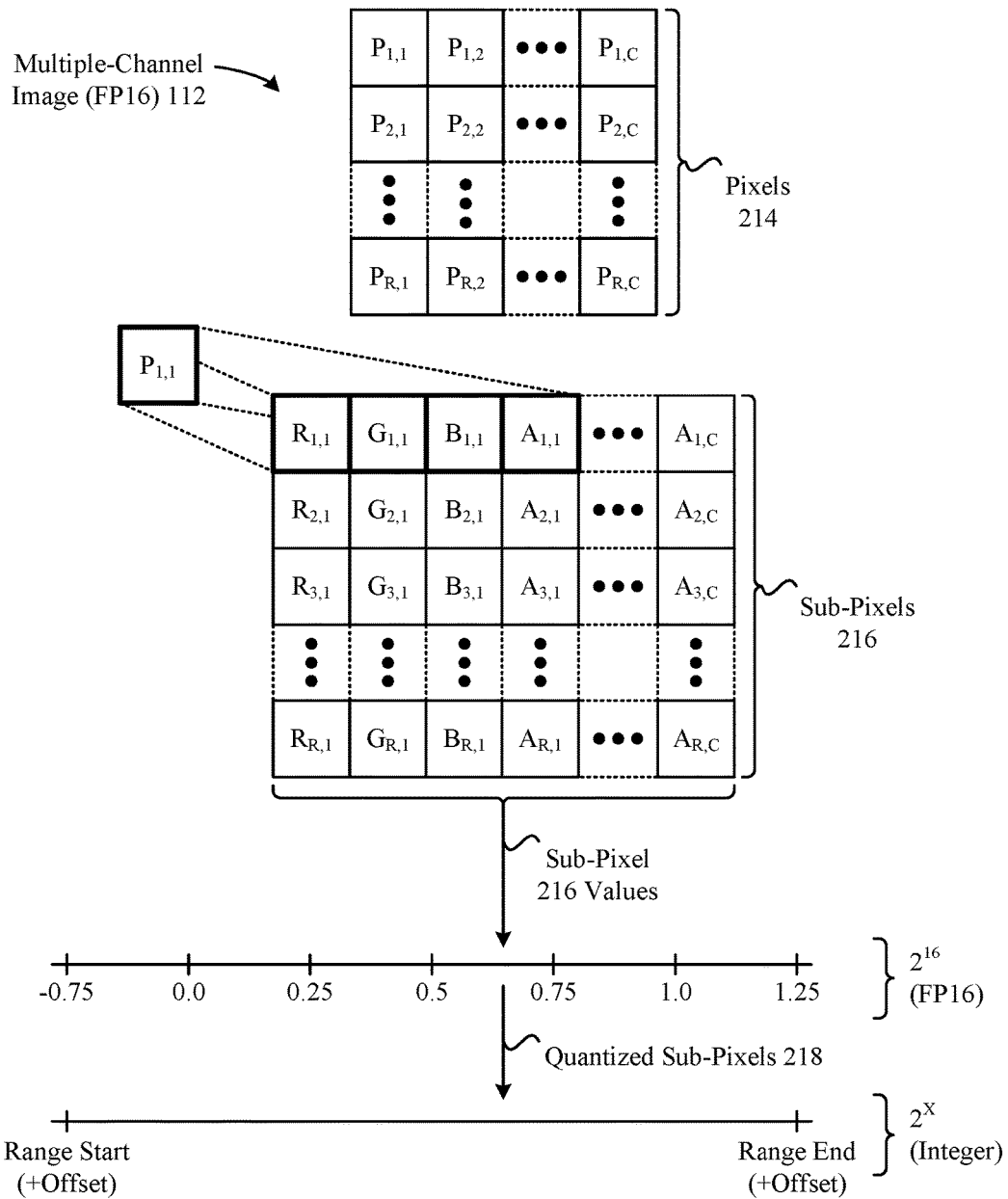
FIGS. 2A-2H illustrate a sequence of conceptual diagrams for pre-processing a floating-point format multiple-channel image for compression, according to some embodiments.

FIGS. 2A-2H illustrate a sequence of conceptual diagrams for pre-processing a multiple-channel image 112 for compression, according to some embodiments. In particular, the conceptual diagrams illustrate a series of steps that the image analyzer 114 (and various sub-components) can be configured to carry out when pre-processing the multiple-channel image 112 for compression by the compressor(s) 132. As shown in FIG. 2A, a first step 210 can involve the first quantizer 116 receiving the multiple-channel image 112, which is composed of pixels 214 (denoted as "P"). As shown in FIG. 2A, the pixels 214 can be arranged according to a row/column layout, where the subscript of each pixel 214 "P" (e.g., "1,1") indicates the location of the pixel 214 in accordance with the rows and columns. In the example illustrated in FIG. 2A, the pixels 214 of the multiple-channel image 112 are arranged in an equal number of rows and columns, such that the multiple-channel image 112 is a square image. However, it is noted that the techniques described herein can be applied to multiple-channel images 112 having different layouts (e.g., disproportionate row/column counts).

In any case, as shown in FIG. 2A, each pixel 214 is composed of four sub-pixels 216—a red sub-pixel 216 (denoted "R"), a green sub-pixel 216 (denoted "G"), a blue sub-pixel (denoted "B") 216, and an alpha sub-pixel 216 (denoted "A"). It is noted that the alpha sub-pixel 216 can be excluded from the sub-pixels 216 without departing from the scope of this disclosure. In particular, the techniques performed in conjunction with step 210 of FIG. 2A can be omitted when the multiple-channel image 112 does not include an alpha channel (e.g., and instead is an RGB image), while continuing to achieve at least a subset of the compression benefits described herein.

In any case, as previously described herein, the multiple-channel image 112 can be received in an FP16 format, where each sub-pixel 216 is assigned a respective 16-bit floating point value (e.g., within the range [−0.75 to 1.25]). Notably, due to the intrinsic design of the FP16 format, the distribution of bits in a given FP16 value causes an overall precision of the FP16 value to correspondingly decrease as the FP16 value increases. In particular, small FP16 values—e.g., those close to 0.0—have a high amount of precision, whereas large FP16 values e.g., those close to 1.0—have a low amount of precision (relative to the small FP16 values). In this regard, the high amount of precision for a small FP16 value (~0.0) of a given sub-pixel 216 significantly exceeds the amount of precision required to represent the original value of the given sub-pixel 216. Conversely, the lower amount of precision for a large FP16 value (~1.0) of a given sub-pixel 216 normally satisfies the amount of precision required to represent the original value of the given sub-pixel 216. In this regard, the first quantizer 116 can be configured to quantize the pixels 214—in particular, each sub-pixel 216 of the pixels 214—of the multiple-channel image 112 into a fixed range of values such that their color values are represented with the same absolute precision over the fixed range of values. For example, when the FP16 value of a given sub-pixel 216 falls within the range of [−0.75 to 1.25], the fixed range of values can span $2^{10}$ values [i.e., −384 to 639], $2^{11}$ values [i.e., −768 to 1279], etc., depending on the acceptable level of quality loss that is incurred as a result of the quantization. This notion is illustrated in FIG. 2A as the quantization of the sub-pixel 216 values, which produces quantized sub-pixels 218.

Additionally, the offsetter 118 can be configured to work in conjunction with the first quantizer 116 to establish an offset to be added to the quantized sub-pixels 216 to account for the fact that the distribution of the color values of the multiple-channel image 112 typically is not uniform over the fixed range of values described above. In particular, the offsetter 118 can be configured to analyze the distribution of the color values of the multiple-channel image 112—e.g., based on a histogram of the multiple-channel image 112—to identify color values that are most-common across the multiple-channel image 112. For example, the offsetter 118 can identify, for the multiple-channel image 112, that the typical FP16 values for the sub-pixels 216 of the various pixels 214 are around 0.5, which corresponds to an offset of two hundred fifty-six (256) when the fixed range of values spans [0 to $2^{10}$] values. In this regard, the offset of two hundred fifty-six (256) can be subtracted from each of the quantized sub-pixel values established by the first quantizer 116 (in accordance with the techniques described above), thereby establishing a distribution that is centered closer to zero (0.0). This notion is illustrated in FIG. 2A as the quantization of the sub-pixel 216 values, which takes into account an offset that is applied to the range into which the sub-pixel 216 values are quantized to produce quantized sub-pixels 218. Beneficially, this centering can enhance the overall compression ratios that are ultimately achieved when the pre-processed multiple-channel image 112 is compressed.

Figure 2B:
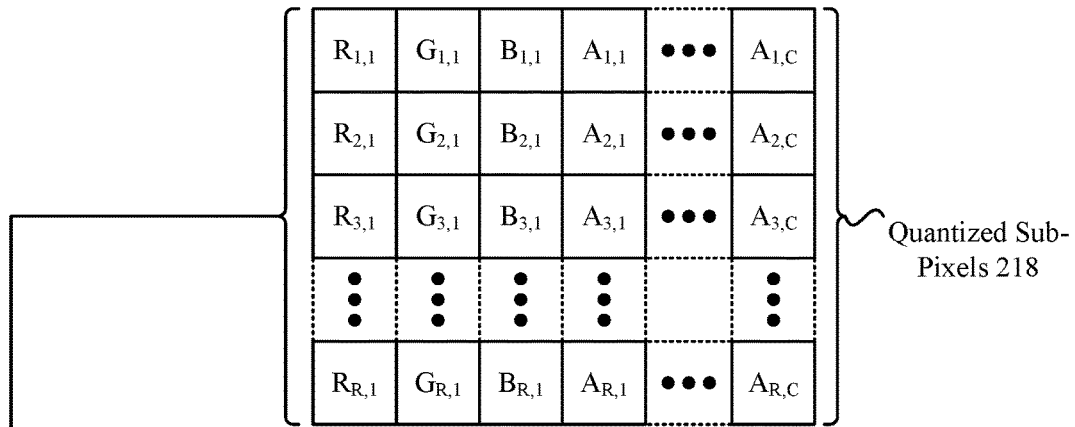
Figure 2B:
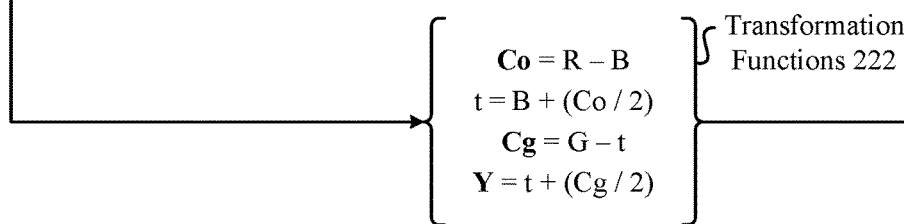
Figure 2B:
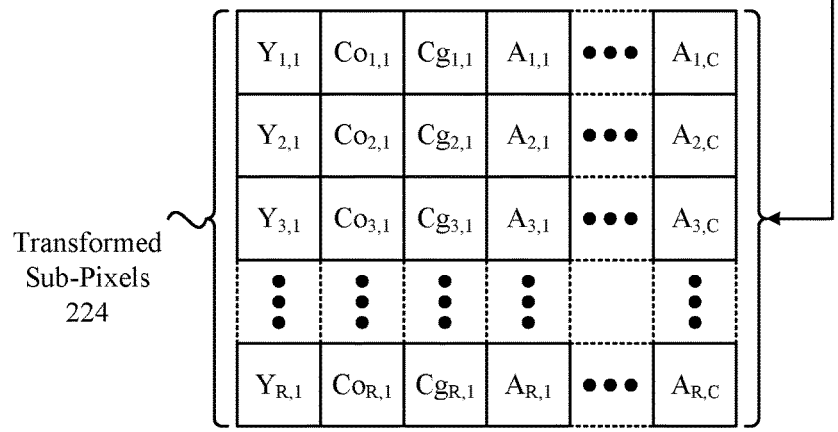

Next, FIG. 2B illustrates a step 220 in which the color space transformer 120 performs a collection of invertible transformation functions 222 on the quantized sub-pixels 218 (e.g., the red sub-pixels 216, the green sub-pixels 216, and the blue sub-pixels 216) of the pixels 214 to produce transformed sub-pixels 224. For example, as shown in FIG. 2B, the transformation functions 222 can involve carrying out a series of operations on the different sub-pixel values 216 to produce a luma value (Y), a first chroma value (Co), and a second chroma value (Cg). In particular, and according to some embodiments, the red sub-pixel 216 can be replaced by the luma value Y, the green sub-pixel 216 can be replaced by the first chroma value Co, and the blue sub-pixel 216 can be replaced by the second chroma value Cg, where the alpha sub-pixel 216 remains intact for subsequent processing. As described in greater detail herein, this decorrelation of the sub-pixels 216 from the RGB color space can increase the overall compressibility of the multiple-channel image 112. Notably, in some cases, the first chroma value Co and the second chroma value Cg can each potentially take the form of a negative number. Accordingly, the color space transformer 120 can add a sign bit to the first chroma value Co and the second chroma value Cg to account for the potential negative values. At this juncture, the overall characteristics of the multiple-channel image 112 are transformed in a manner that enables subsequent functions to be applied to ultimately improve compression ratios when compressing the multiple-channel image 112.

Figure 2C:
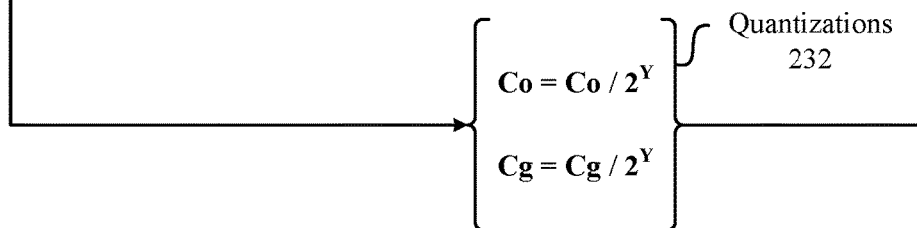

Next, FIG. 2C illustrates a step 330 in which the second quantizer 121 quantizes the transformed sub-pixels 224 to produced transformed sub-pixels 234. In particular, the second quantizer 121 can be configured to quantize the chroma values Co and Cg of each of the transformed sub-pixels 224 based on quantizations 232. Notably, these quantizations cause little to no loss in visual quality, at least in comparison to quantizing the luma values of each of the transformed sub-pixels 224. In this regard, it can be beneficial to perform the quantizations 232, which can reduce the number of bits required to store the chroma values Co and Cg. Accordingly, as shown in FIG. 2C, the second quantizer 121 can be configured to quantize the chroma value Co (of each transformed sub-pixel 224) by dividing the chroma value Co by a power of two (e.g., $2^1$). The second quantizer 121 can also be configured to quantize the chroma value Cg (of each transformed sub-pixel 224) by dividing the chroma value Cg by a power of two (e.g., $2^1$). It is noted that other powers of two (e.g., $2^2$) can be utilized when performing the quantizations 232, but can contribute to decreased levels of visual quality.

Figure 2D:
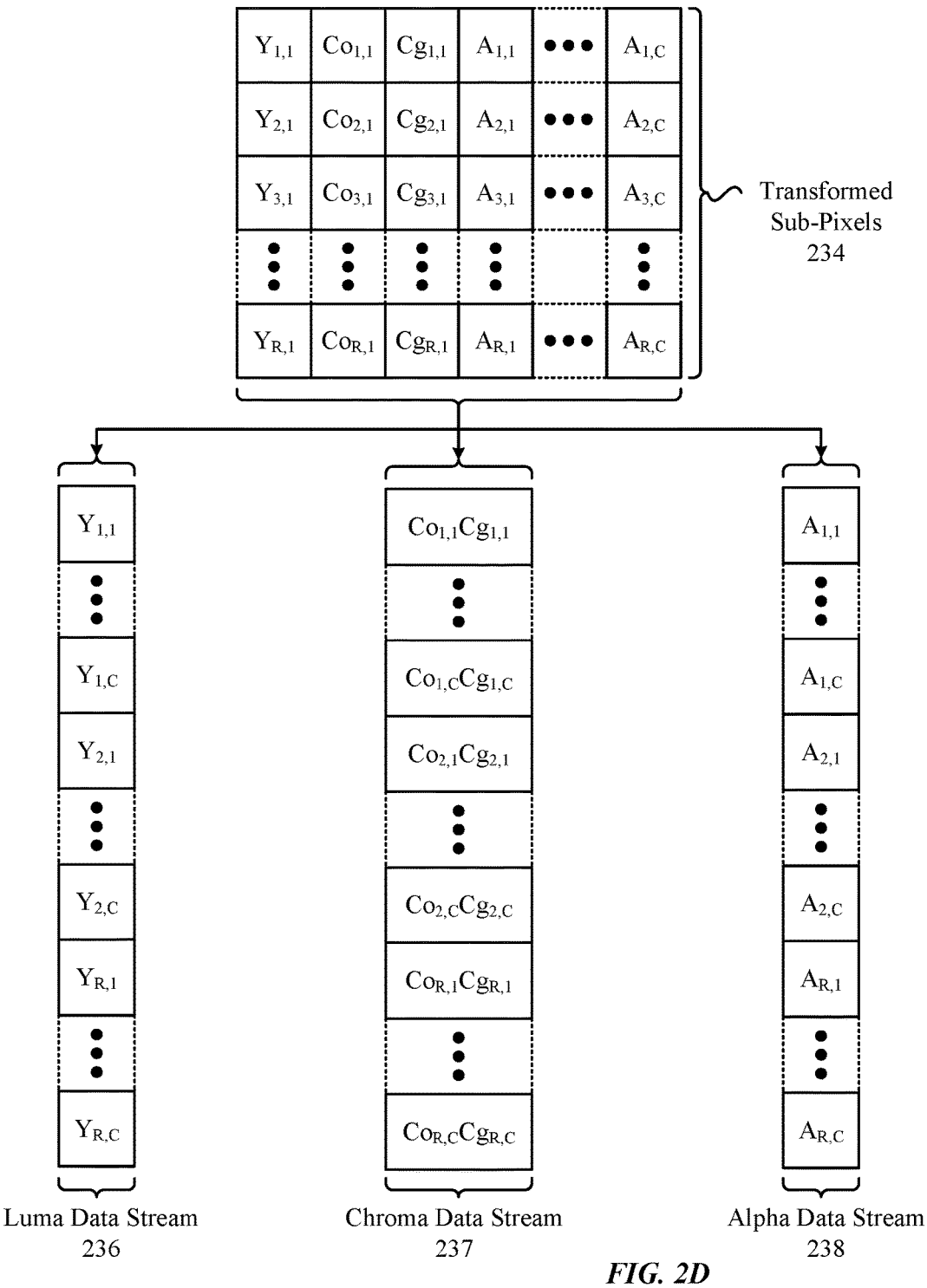

Turning now to FIG. 2D, a step 240 can involve the channel separator 122 separating the sub-pixels 216 of the multiple-channel image 112 into various data streams to further-increase the overall compressibility of the multiple-channel image 112. In particular, and as shown in FIG. 2D, the channel separator 122 can be configured to separate the luma values (of each pixel 214) into a luma data stream 236. As shown in FIG. 2D, the channel separator 122 can extract the luma sub-pixels 216 in left to right (i.e., row-wise)/top down (i.e., column-wise) order, and place the luma sub-pixels 216 into the luma data stream 236. For example, as shown in FIG. 2D, the luma sub-pixel 216 for the first pixel 214 "P(1,1)" can be extracted first, followed by the luma sub-pixel 216 for the second pixel 214 "P(1,2)", and so on. In a similar fashion, the channel separator 122 can also be configured to separate the chroma values (Co, Cg) (of each pixel 214) into a chroma data stream 237. According to some embodiments, separating the luma values into the luma data stream 236—while combining the chroma values (Co, Cg) into the chroma data stream 237—can be referred to as a semi-planar format. However, fully-planar formats can also be utilized, which involve separating the luma values into the luma data stream 236, separating the chroma values Co into the chroma data stream 237, and separating the chroma values Cg into another chroma data stream (not illustrated in FIG. 2D). Additionally, the channel separator 122 can be configured to separate the alpha values (of each pixel 214) into an alpha data stream 238. It is noted that any approach for separating the various sub-pixels 216 of the multiple-channel image 112 can be implemented without departing from the scope of this disclosure. For example, the various sub-pixels 216 can be extracted in any order from the pixels 214 (and placed into the various data streams) without departing from the scope of this disclosure.

Figure 2E:
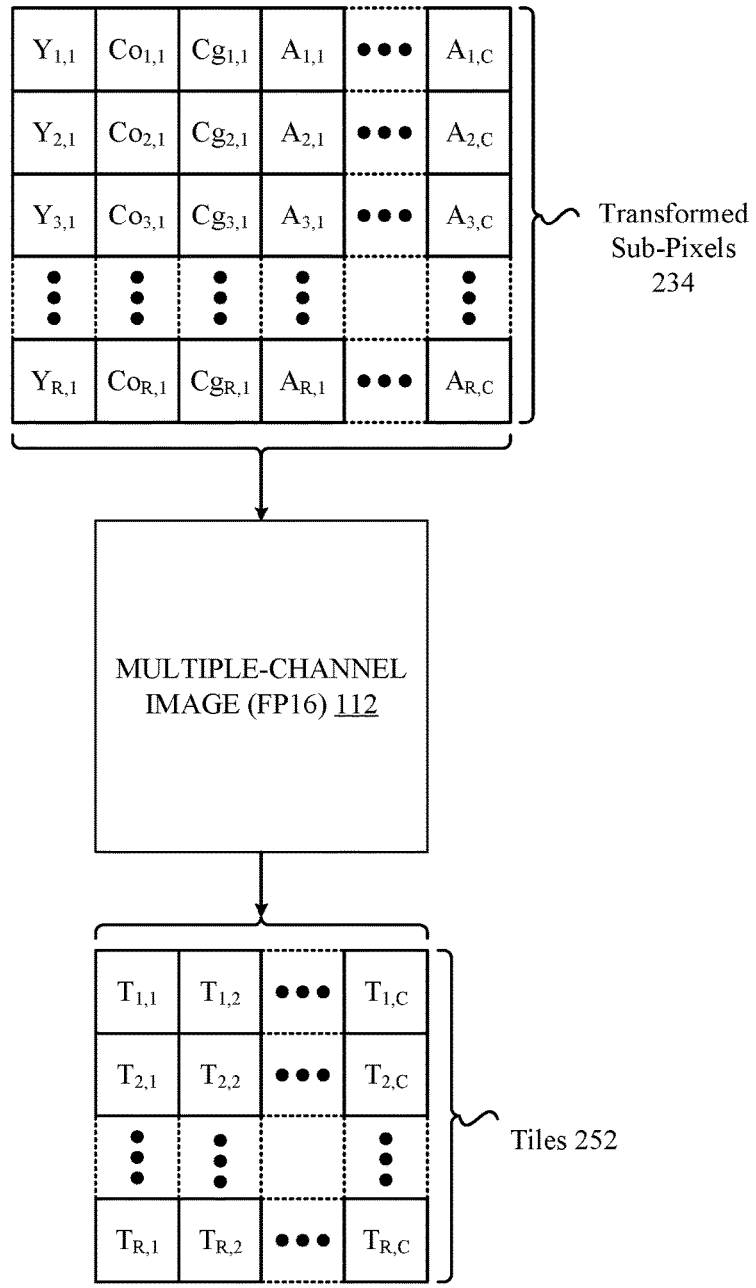

Turning now to FIG. 2E, a step 250 can involve the tiler 124 breaking down the multiple-channel image 112 into smaller segments to improve the overall efficiency associated with compressing or decompressing (at a later time) the multiple-channel image 112. In particular, and as previously described herein, the tiler 124 can be configured to separate the multiple-channel image 112 into two or more tiles 252—i.e., sub-images of the multiple-channel image 112—to enable each tile 252 to be separately streamed from memory and processed when compressing or decompressing the multiple-channel image 112. This approach can provide various benefits in comparison to compressing or decompressing the multiple-channel image 112 image as a whole. For example, when multiple processors and/or software threads are available, they can be tasked to work on respective tiles 252 such that the multiple-channel image 112 is compressed or decompressed in a parallel manner. In another example, each tile 252 can be processed in succession such that only a fraction of the volatile memory 106 is required in comparison to an amount of the non-volatile memory that otherwise would be required to store the multiple-channel image 112 as a whole.

Figure 2F:
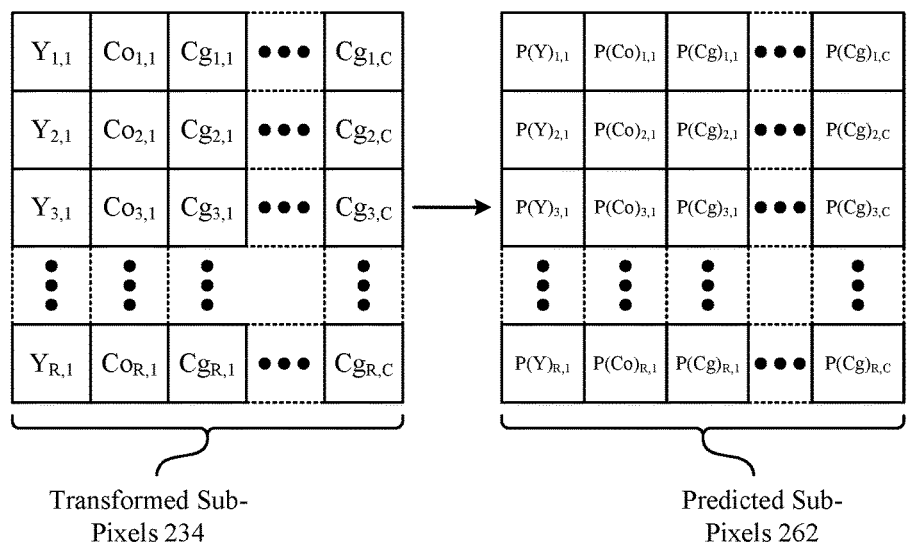
Figure 2F:
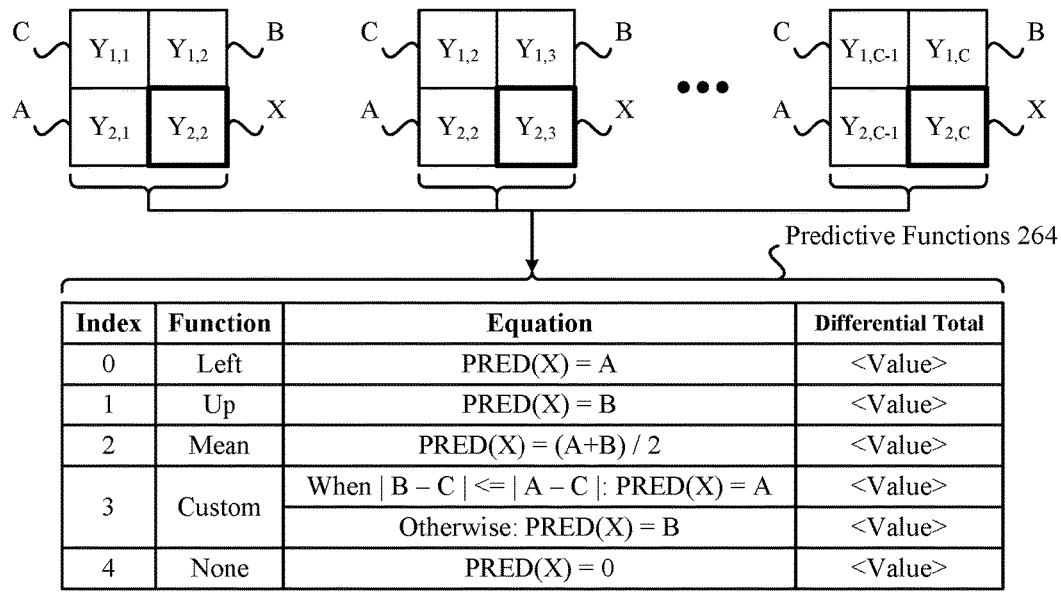

Turning now to FIG. 2F, a step 260 can involve the predictor 126 identifying various predictive functions that can be applied against the multiple-channel image 112 to further-increase the overall compressibility of the multiple-channel image 112. Notably, in the interest of simplifying this disclosure, the illustration in FIG. 2F pertains to processing the multiple-channel image 112 as a whole—in particular, the transformed sub-pixels 234 of the multiple-channel image 112—as opposed to individual tiles 252 of the multiple-channel image 112 (as described above in conjunction with FIG. 2E). However, it should be appreciated that the various techniques described in conjunction with FIG. 2F—as well as FIGS. 2G-2H—can be applied to each tile 252 of the multiple-channel image 112 when the multiple-channel image 112 is separated into two or more tiles 252, without departing from the scope of this disclosure.

In any case, as shown in FIG. 2F, the predictor 126 identifies, for each row of the transformed sub-pixels 234 of the multiple-channel image 112, a predictive function 264 (from among a group of predictive functions 264) that yields the most desirable prediction differentials (i.e., prediction error) within the scope of the row. An example scenario is shown FIG. 2F, in which the second row of the transformed sub-pixels 234 that correspond to the luma value are processed using each of the Left, Up, Mean, and Custom predictive functions 264 to produce prediction differentials. Although not illustrated in FIG. 2F, it will be understood that the example scenario can also involve processing the second row of the different transformed sub-pixels 234 that correspond to the chroma values (Co, Cg) using each of the Left, Up, Mean, and Custom predictive functions 264 to produce corresponding prediction differentials. In turn, the prediction differentials (corresponding to the luma value and chroma values (Co, Cg) within the second row) can be summed to establish a prediction differential total (performed separately for each of the predictive functions 264 applied against the second row). For example, as illustrated in FIG. 2F, the column "Differential Total" in the table of predictive functions 264 can be populated, for each row of transformed sub-pixels 234, with the values of the differential totals for the different predictive functions 264 applied against the row so that the most desirable predictive function 264 can be identified for the row.

In accordance with the foregoing techniques, the predictor 126 can identify a most effective predictive function 264 for the second row based on the prediction differential totals. It is noted that the predictor 126 can implement any form of arithmetic when calculating the prediction differentials/prediction differential totals described herein. For example, the predictor 126 can be configured to sum the absolute value of the prediction differentials for the transformed sub-pixels 234 of a given row (for each of the different predictive functions 264), and select the predictive function 264 that yields the smallest prediction differential total. In another example, the predictor 126 can (i) sum the prediction differentials for the transformed sub-pixels 234 of a given row (for each of the different predictive functions 264), (ii) take the logarithm of the sums to produce logarithmic values, and (iii) select the predictive function 264 that yields the smallest logarithmic value. It is noted that the predictive functions 264 illustrated in FIG. 2F are merely exemplary, and that the predictor 126 can be configured to implement any number/type of predictive functions 264 without departing from the scope of this disclosure.

Figure 2G:
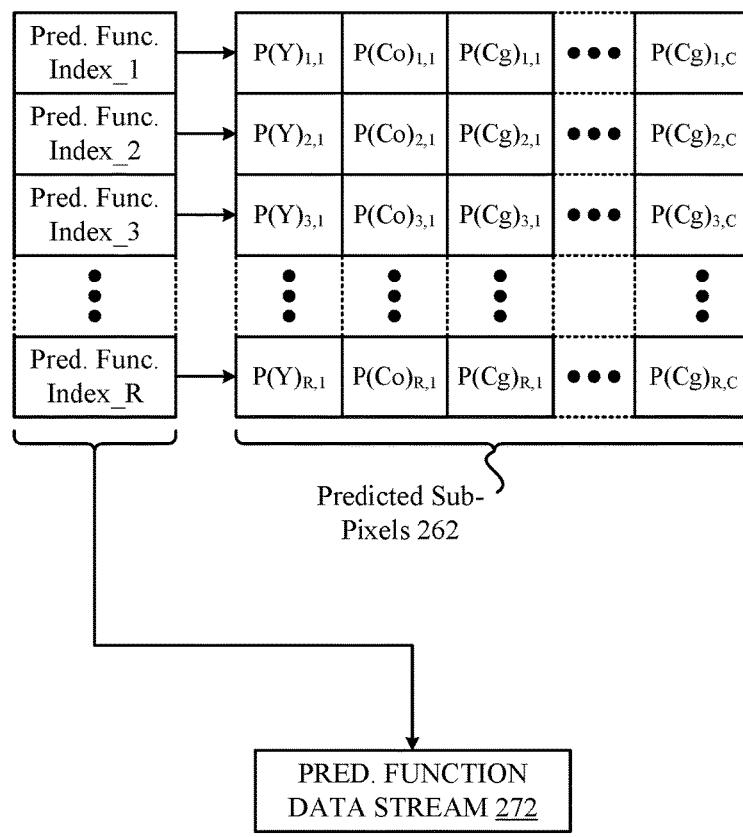

In any case, turning now to FIG. 2G, a step 270 can involve the predictor 126, for each row of the transformed sub-pixels 234, (1) identifying the predictive function 264 most appropriate for the row of the transformed sub-pixels 234, and (2) storing an identifier for the predictive function 264 within a predictive function data stream 272. For example, as shown in FIG. 2G, the predictor 126 can identify the index of the selected predictive function 264 (e.g., in accordance with the table of predictive functions 264 illustrated in FIG. 2F) for each row of the transformed sub-pixels 234, and sequentially store the indices of the selected predictive functions 264 into the predictive function data stream 272.

Accordingly, at the conclusion of step 270 in FIG. 2G, four separate data streams have been prepared—the luma data stream 236, the chroma data stream 237, the alpha data stream 238, and the predictive function data stream 272. At this juncture, the selected predictive functions 264 are applied against their respective rows of transformed sub-pixels 224 to establish predicted sub-pixels 262 (e.g., as illustrated in FIGS. 2F-2G). It is noted that sign bits can be added to the predicted sub-pixels 262 to account for any negative differential values established by way of the predictive functions 264 (e.g., by subtracting predicted values from their respective transformed sub-pixels 234). At this juncture, additional operations can be performed against the predicted sub-pixels 262 to further-enhance the resulting compression ratios that can be achieved, which are described below in greater detail in conjunction with FIG. 2H.

Figure 2H:
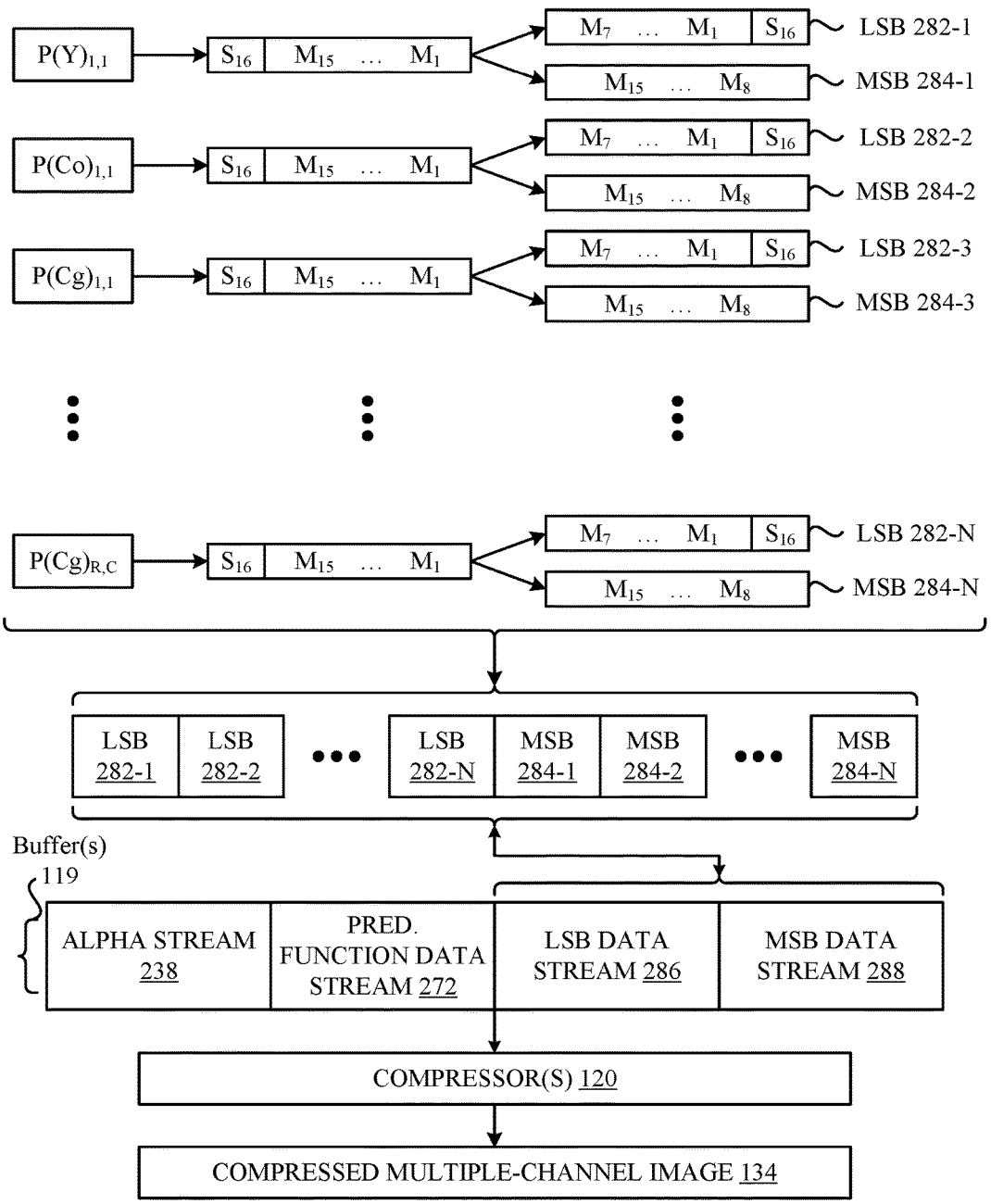

As shown in FIG. 2H, a final step 280 can involve the encoder 128 separating the predicted sub-pixels 262 into a least significant byte 282 and a most significant byte 284. For example, as shown in FIG. 2H, the prediction differential for the luma value (of the pixel 214 (1,1))—which includes (1) a sign bit (S16) established by way of the predictive functions 264 (applied in FIGS. 2F-2G), and (2) up to fifteen magnitude bits (M15-M1) (i.e., the prediction differential itself)—can be separated into a least significant byte 282-1 and a most significant byte 284-1. In particular, the sign bit (S16) can be positioned within a least significant bit of the least significant byte 282, followed by seven of the least significant magnitude bits (M7-M1). Additionally, eight of the most significant magnitude bits (M15-M8) can be positioned within the most significant byte 284-1.

Additionally, as shown in FIG. 2H, the prediction differential for the chroma value Co (of the pixel 214 (1,1))—which includes (1) a sign bit (S16) established by way of the predictive functions 264 (applied in FIGS. 2F-2G), and (2) up to fifteen magnitude bits (M15-M1) (i.e., (i) the first sign bit established by the transformation functions 222 (applied in FIG. 2B), and (ii) the prediction differential itself)—can be separated into a least significant byte 282-2 and a most significant byte 284-2. Similarly, the prediction differential for the chroma value Cg (of the pixel 214 (1,1))—which includes (1) the sign bit (S16) established by way of the predictive functions 264 (applied in FIGS. 2F-2G), and (2) up to fifteen magnitude bits (M15-M1) (i.e., (i) the first sign bit established by the transformation functions 222 (applied in FIG. 2B), and (ii) the prediction differential itself)—can be separated into a least significant byte 282-3 and a most significant byte 284-3.

It is noted that the encoder 128 can perform the foregoing techniques using a variety of approaches, e.g., performing in-place modifications, copying the predicted sub-pixels 262 into respective data structures for the least significant bytes 282 and the most significant bytes 284, and so on. It is also noted that the distributions illustrated in FIG. 2H and described herein are exemplary, and that any distribution of the bits of the predicted sub-pixels 262 can be utilized without departing from the scope of this disclosure.

In any case, when the encoder 128 establishes the least significant bytes 282 and the most significant bytes 284 for each of the predicted sub-pixels 262, the encoder 128 can group the least significant bytes 282 into a least significant byte data stream 286 (e.g., in a left to right (i.e., row-wise)/top down (i.e., column-wise) order). Similarly, the encoder 128 can group the most significant bytes 284 into a most significant bye data stream 288 (e.g., in a left to right (i.e., row-wise)/top down (i.e., column-wise) order). In turn, the encoder 128 can provide the alpha stream 238, the predictive function data stream 272, the least significant bye data stream 286, and the most significant byte data stream 288 to the buffer(s) 130, and invoke the compressor(s) 132 to compress the buffer(s) 130. Subsequently, the compressor(s) 132 can take action and compress the contents of the buffer(s) 130 to produce a compressed multiple-channel image 134.

It is noted that the compressor(s) 132 can be configured to analyze one or more of the data streams to identify a compression technique that yields a most desirable compression ratio. In particular, different floating-point format multiple-channel images—as well as the manner in which they are processed in accordance with the techniques set forth herein—can cause the resulting data streams to possess certain properties that can enable certain types of compressors to yield higher compression ratios. For example, the compressor(s) 132 can be configured to implement a Lempel-Ziv+Finite State Entropy (LZFSE) compressor, an LZVN compressor, an LZ4 compressor, and so on, in accordance with an analysis of which pre-processing steps were carried out, the contents of the data streams, and so on. It is noted that the foregoing compressors are exemplary, and that the compressor(s) 132 can be configured to implement any compression technology without departing from the scope of this disclosure. In any case, the compressed multiple-channel image 134 can be updated to include information that identifies the compression technology utilized by the compressor(s) 132. In this manner, when the compressed multiple-channel image 134 is decompressed by one or more decompression engines at a later time, the appropriate compression technology can be implemented to perform the decompression.

Additionally, it is noted that the image analyzer 114 can be configured to pre-process the multiple-channel image 112 using other approaches to identify additional optimizations that can be afforded with respect to compressing the multiple-channel image 112. For example, the image analyzer 114 can be configured to take advantage of any symmetry that is identified within the multiple-channel image 112. For example, the image analyzer 114 can be configured to (1) identify vertical symmetry, horizontal symmetry, diagonal symmetry, etc., within the multiple-channel image 112, (2) carve out the redundant pixels 214, and (3) process the remaining pixels 214. For example, when a multiple-channel image 112 is both vertically and horizontally symmetric, the image analyzer 114 can process only a single quadrant of the multiple-channel image 112 to increase efficiency. In another example, when the multiple-channel image 112 is diagonally symmetrical, the image analyzer 114 can process only a single triangular portion of the multiple-channel image 112 to increase efficiency. In yet another example, the image analyzer 114 can be configured to identify symmetry within different segments (e.g., one or more rows, columns, tiles, etc.) of the multiple-channel image 112 as opposed to only identifying symmetry across the entirety of the multiple-channel image 112. In any case, when these efficiency measures are invoked, the image analyzer 114 can be configured to store, within the compressed multiple-channel image 134, information about the symmetry so that the disregarded portions can be re-established when the compressed multiple-channel image 134 is decompressed/rebuilt at the computing device 102.

Figure 3A:
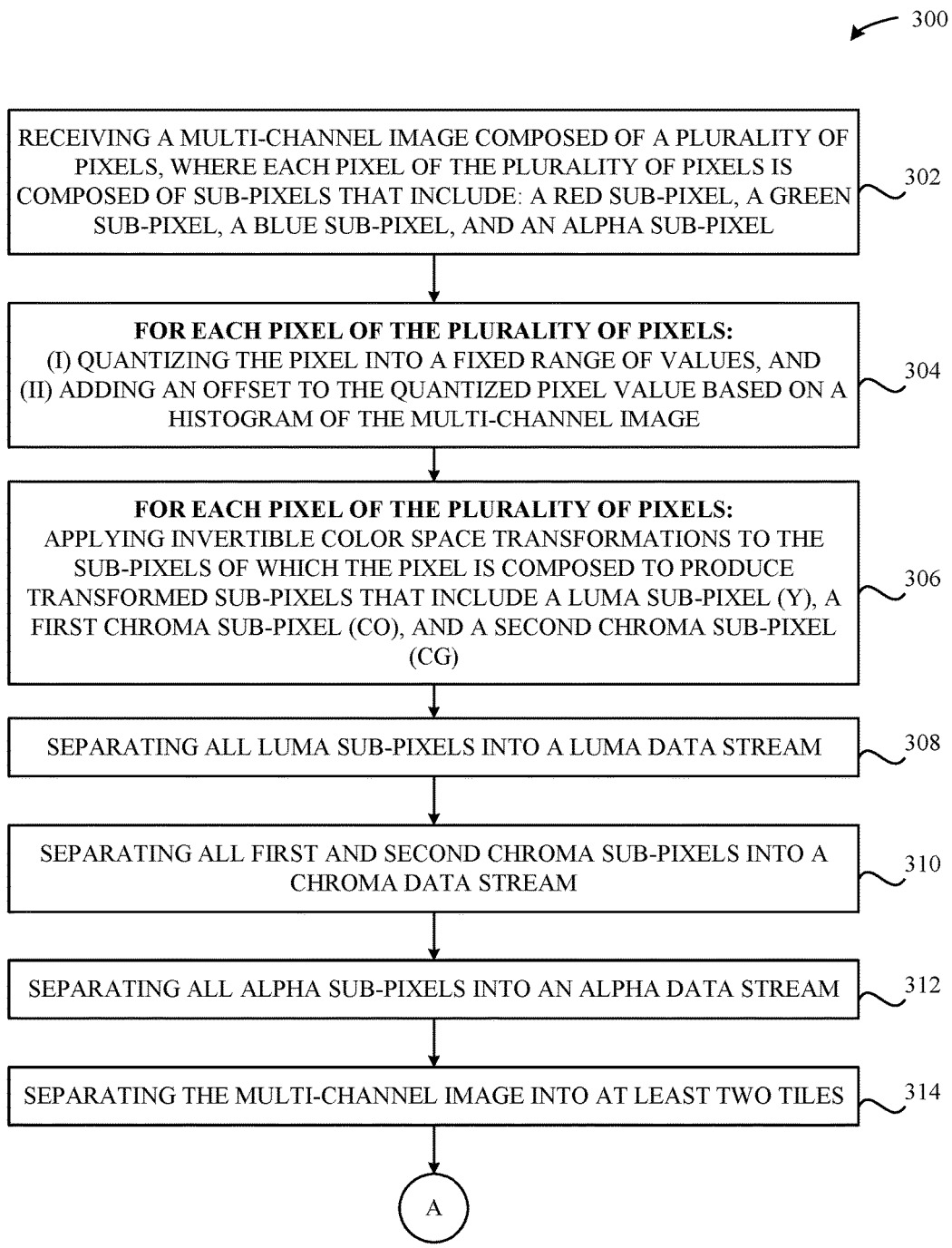
FIGS. 3A-3B illustrate a method for pre-processing a floating-point format multiple-channel image for compression, according to some embodiments.
Figure 3B:
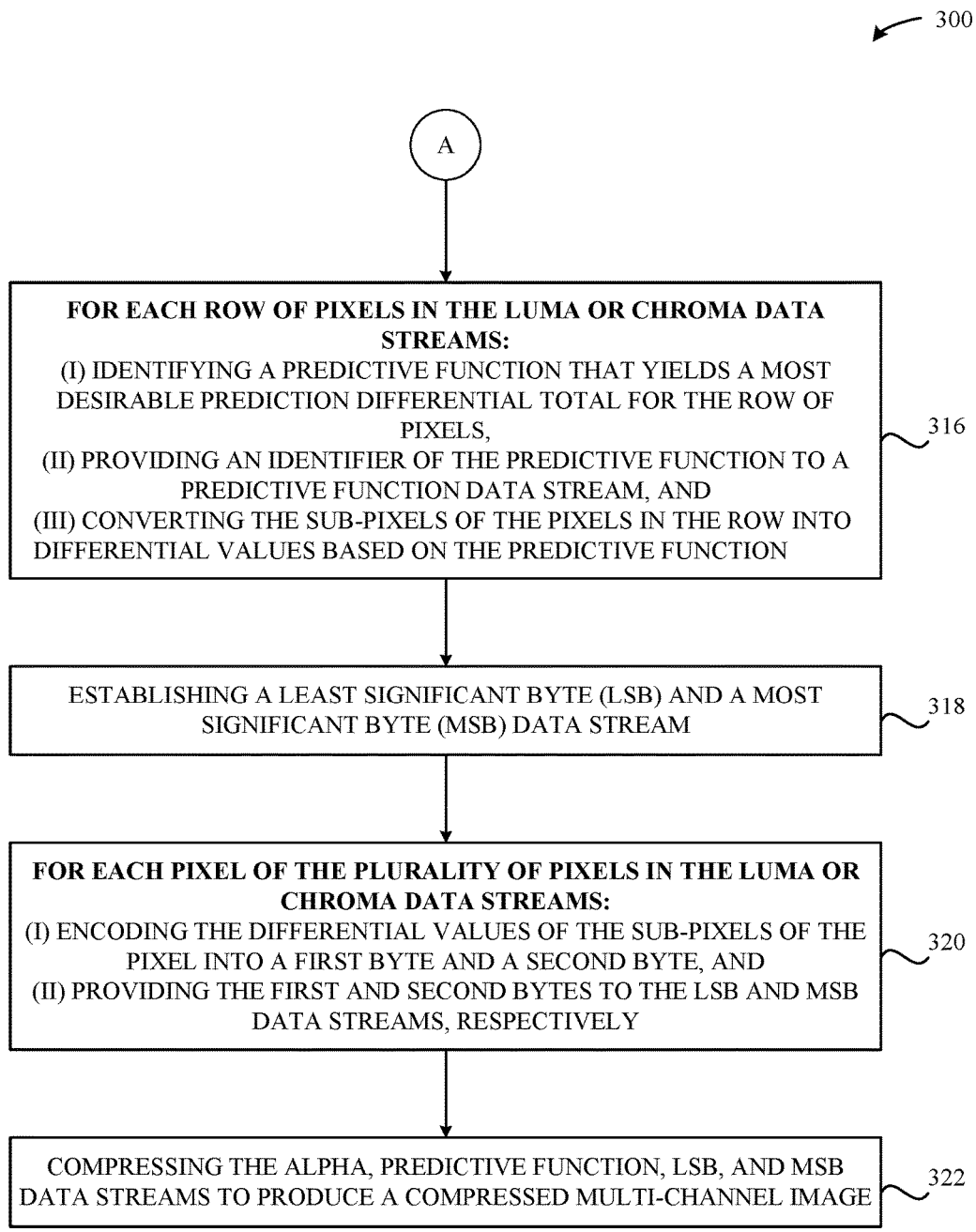

FIGS. 3A-3B illustrate a high-level method 300 of the various techniques set forth herein for pre-processing a multiple-channel image 112 for compression, according to some embodiments. As shown in FIG. 3A, the method 300 begins at step 302, where the image analyzer 114 receives a multi-channel image composed of a plurality of pixels, where each pixel of the plurality of pixels is composed of sub-pixels that include: a red sub-pixel, a green sub-pixel, a blue sub-pixel, and an alpha sub-pixel (e.g., as described above in conjunction with FIG. 2A). At step 304, the image analyzer 114 performs the following procedures for each pixel of the plurality of pixels: (i) quantizing the pixel into a fixed range of values (e.g., as described above in conjunction with FIG. 2A), and (ii) adding an offset to the quantized pixel value based on a histogram of the multi-channel image (e.g., as also described above in conjunction with FIG. 2A).

At step 306, the image analyzer 114 performs the following procedures for each pixel of the plurality of pixels: applying invertible color space transformations to the sub-pixels of which the pixel is composed to produce transformed sub-pixels that include a luma sub-pixel (Y), a first chroma sub-pixel (Co), and a second chroma sub-pixel (Cg) (e.g., as described above in conjunction with FIG. 2B).

At step 308, the image analyzer 114 separates all luma sub-pixels into a luma data stream (e.g., as described above in conjunction with FIG. 2D). At step 310, the image analyzer 114 separates all first and second chroma sub-pixels into a chroma data stream (e.g., as also described above in conjunction with FIG. 2D). At step 312, the image analyzer 114 separates all alpha sub-pixels into an alpha data stream (e.g., as further described above in conjunction with FIG. 2D).

At step 314, the image analyzer 114 separates the multi-channel image into at least two tiles (e.g., as described above in conjunction with FIG. 2E). At step 316, the image analyzer 114 performs the following procedures for each row of pixels in the luma or chroma data streams: (i) identifying a predictive function that yields a most desirable prediction differential total for the row of pixels (e.g., as described above in conjunction with FIG. 2F), (ii) providing an identifier of the predictive function to a predictive function data stream (e.g., as described above in conjunction with FIG. 2G), and (iii) converting the sub-pixels of the pixels in the row into differential values based on the predictive function (e.g., as described above in conjunction with FIGS. 2F-2G).

At step 318, the image analyzer 114 establishes a least significant byte and a most significant byte data stream (e.g., as described above in conjunction with FIG. 2H). At step 320, the image analyzer 114 performs the following procedures for each pixel of the plurality of pixels in the luma or chroma data streams: (i) encoding the differential values of the sub-pixels of the pixel into a first byte and a second byte (e.g., as also described above in conjunction with FIG. 2H), and (ii) providing the first and second bytes to the least significant byte and most significant byte data streams, respectively (e.g., as also described above in conjunction with FIG. 2H). Finally, at step 322, the image analyzer 114 compresses the alpha, predictive function, least significant byte, and most significant byte data streams to produce a compressed multi-channel image (e.g., as further described above in conjunction with FIG. 2H).

FIG. 4 illustrates a detailed view of a computing device 400 that can be used to implement the various techniques described herein, according to some embodiments. In particular, the detailed view illustrates various components that can be included in the computing device 102 described in conjunction with FIG. 1. As shown in FIG. 4, the computing device 400 can include a processor 402 that represents a microprocessor or controller for controlling the overall operation of the computing device 400. The computing device 400 can also include a user input device 408 that allows a user of the computing device 400 to interact with the computing device 400. For example, the user input device 408 can take a variety of forms, such as a button, keypad, dial, touch screen, audio input interface, visual/image capture input interface, input in the form of sensor data, and so on. Still further, the computing device 400 can include a display 410 that can be controlled by the processor 402 (e.g., via a graphics component) to display information to the user. A data bus 416 can facilitate data transfer between at least a storage device 440, the processor 402, and a controller 413. The controller 413 can be used to interface with and control different equipment through an equipment control bus 414. The computing device 400 can also include a network interface 411 that couples to a data link 412. In the case of a wireless connection, the network interface 411 can include a wireless transceiver.

As noted above, the computing device 400 also includes the storage device 440, which can comprise a single disk or a collection of disks (e.g., hard drives). In some embodiments, storage device 440 can include flash memory, semiconductor (solid state) memory or the like. The computing device 400 can also include a Random-Access Memory (RAM) 420 and a Read-Only Memory (ROM) 422. The ROM 422 can store programs, utilities or processes to be executed in a non-volatile manner. The RAM 420 can provide volatile data storage, and stores instructions related to the operation of applications executing on the computing device 400, e.g., the image analyzer 114/compressor(s) 132.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for pre-processing a multiple-channel image for compression, the method comprising:
   receiving the multiple-channel image, wherein the multiple-channel image is composed of a plurality of pixels, and each pixel of the plurality of pixels is composed of sub-pixels;
   for each pixel of the plurality of pixels:
      quantizing the pixel into a fixed range of values, and
      applying invertible color-space transformations to the sub-pixels of the pixel to produce transformed first, second, and third sub-pixels;
   separating (i) all first sub-pixels into first data stream, (ii) all second sub-pixels into a second data stream, and (iii) all third sub-pixels into a third data stream;
   applying predictive functions to first and second data streams;
   for each pixel of the plurality of pixels in the first or second data stream;
   separating the pixel into least significant byte (LSB) and most significant byte (MSB) data streams; and
   compressing the third, LSB, and MSB data streams to produce a compressed multiple-channel image.

2. The method of claim 1, wherein:
   for each pixel of the plurality of pixels:
      the sub-pixels of the pixel include a red sub-pixel, a green sub-pixel, a blue sub-pixel, and an alpha sub-pixel, and
      the transformed first sub-pixel represents a luma sub-pixel, the transformed second sub-pixel represents a first chroma sub-pixel, and the transformed third sub-pixel represents a second chroma sub-pixel; and
   the first data stream represents a luma data stream, the second data stream represents a chroma data stream, and the third data stream represents an alpha data stream.

3. The method of claim 2, further comprising, for each row of pixels in the luma or chroma data streams:
   (i) identifying a predictive function that yields a most desirable prediction differential total for the row of pixels, and
   (ii) converting the sub-pixels of the pixels in the row into differential values based on the predictive function.

4. The method of claim 3, further comprising, for each row of pixels in the luma or chroma data streams:
   providing, to a predictive function data stream, an identifier of the predictive function applied to the row of pixels, wherein the predictive function data stream is also compressed to produce the multiple-channel image.

5. The method of claim 3, wherein, for each pixel of the plurality of pixels in the luma or chroma data streams, separating the pixels into the LSB and the MSB data streams comprises:

(i) encoding the differential values of the sub-pixels of the pixel into a first byte and a second byte, and
(ii) providing the first and second bytes to the LSB and MSB data streams, respectively.

6. The method of claim 2, further comprising, prior to applying predictive functions to the luma data stream and the chroma data stream:
separating the multiple-channel image into at least two tiles, wherein each tile of the at least two tiles corresponds to a respective subset of pixels selected from the plurality of pixels.

7. The method of claim 6, wherein the respective subsets of pixels corresponding to the at least two tiles are separately streamed from memory and processed when decompressing the multiple-channel image.

8. The method of claim 2, wherein the alpha, LSB, and MSB data streams are compressed using a Lempel-Ziv+ Finite State Entropy (LZFSE), LZVN, or LZ4 compressor.

9. The method of claim 8, further comprising:
analyzing one or more of the alpha, LSB, and MSB data streams to select from the LZFSE, LZVN, or LZ4 compressors.

10. At least one non-transitory computer readable storage medium configured to store instructions that, when executed by at least one processor included in a computing device, cause the computing device to pre-process a multiple-channel image for compression, by carrying out steps that include:
receiving the multiple-channel image, wherein the multiple-channel image is composed of a plurality of pixels, and each pixel of the plurality of pixels is composed of sub-pixels;
for each pixel of the plurality of pixels:
quantizing the pixel into a fixed range of values, and
applying invertible color-space transformations to the sub-pixels of the pixel to produce transformed first, second, and third sub-pixels;
separating (i) all first sub-pixels into a first data stream, (ii) all second sub-pixels into a second data stream, and (iii) all third sub-pixels into a third data stream;
applying predictive functions to the first and second data streams;
for each pixel of the plurality of pixels in the first or second data stream:
separating the pixel into least significant byte (LSB) and most significant byte (MSB) data streams; and
compressing the third, LSB, and MSB data streams to produce a compressed multiple-channel image.

11. The at least one non-transitory computer readable storage medium of claim 10, wherein:
for each pixel of the plurality of pixels:
the sub-pixels of the pixel include a red sub-pixel, a green sub-pixel, a blue sub- pixel, and an alpha sub-pixel, and
the transformed first sub-pixel represents a luma sub-pixel, the transformed second sub-pixel represents a first chroma sub-pixel, and the transformed third sub-pixel represents a second chroma sub-pixel; and
the first data stream represents a luma data stream, the second data stream represents a chroma data stream, and the third data stream represents an alpha data stream.

12. The at least one non-transitory computer readable storage medium of claim 11, wherein the steps further include, for each row of pixels in the luma or chroma data streams:

(i) identifying a predictive function that yields a most desirable prediction differential total for the row of pixels, and
(ii) converting the sub-pixels of the pixels in the row into differential values based on the predictive function.

13. The at least one non-transitory computer readable storage medium of claim 12, wherein the steps further include, for each row of pixels in the luma or chroma data streams:
providing, to a predictive function data stream, an identifier of the predictive function applied to the row of pixels, wherein the predictive function data stream is also compressed to produce the multiple-channel image.

14. The at least one non-transitory computer readable storage medium of claim 12, wherein, for each pixel of the plurality of pixels in the luma or chroma data streams, separating the pixels into the LSB and the MSB data streams comprises:
(i) encoding the differential values of the sub-pixels of the pixel into a first byte and a second byte, and
(ii) providing the first and second bytes to the LSB and MSB data streams, respectively.

15. The at least one non-transitory computer readable storage medium of claim 11, wherein the steps further include, prior to applying predictive functions to the luma data stream and the chroma data stream:
separating the multiple-channel image into at least two tiles, wherein each tile of the at least two tiles corresponds to a respective subset of pixels selected from the plurality of pixels.

16. A computing device configured to pre-process a multiple-channel image for compression, the computing device comprising:
at least one processor; and
at least one memory storing instructions that, when executed by the at least one processor, cause the computing device to:
receive the multiple-channel image, wherein the multiple-channel image is composed of a plurality of pixels, and each pixel of the plurality of pixels is composed of sub-pixels;
for each pixel of the plurality of pixels:
quantize the pixel into a fixed range of values, and
apply invertible color-space transformations to the sub-pixels of the pixel to produce transformed first, second, and third sub-pixels;
separate (i) first sub-pixels into a first data stream, (ii) all second sub-pixels into a second data stream, and (iii) third sub-pixels into a third data stream;
applying predictive functions to the first and second data streams;
for each pixel of the plurality of pixels in the first or second data stream:
separating the pixel into least significant byte (LSB) and most significant byte (MSB) data streams; and
compressing the third, LSB, and MSB data streams to produce a compressed multiple-channel image.

17. The computing device of claim 16, wherein:
for each pixel of the plurality of pixels the sub-pixels of the pixel include a red sub-pixel, a green sub-pixel, a blue sub-pixel, and an alpha sub-pixel, and
the transformed first sub-pixel represents a luma sub-pixel, the transformed second sub-pixel represents a first chroma sub-pixel, and the transformed third sub-pixel represents a second chroma sub-pixel; and the first data stream represents a luma data stream, second data stream represents a chroma data stream, and the third data stream represents an alpha data stream.

18. The computing device of claim 17, wherein the at least one processor further causes the computing device to, for each row of pixels in the luma or chroma data streams:
(i) identify a predictive function that yields a most desirable prediction differential total for the row of pixels, wherein and
(ii) convert the sub-pixels of the pixels in the row into differential values based on the predictive function.

19. The computing device of claim 17, wherein the at least one processor further causes the computing device to, for each row of pixels in the luma or chroma data streams:
provide, to a predictive function data stream, an identifier of the predictive function applied to the row of pixels, wherein the predictive function data stream is also compressed to produce the multiple-channel image.

20. The computing device of claim 16, wherein for each pixel of the plurality of pixels in the luma or chroma data streams, separating the pixels into the LSB and the MSB data streams comprises:
(i) encoding the differential values of the sub-pixels of the pixel into a first byte and a second byte, and
(ii) providing the first and second bytes to the LSB and MSB data streams, respectively.

* * * * *

UNITED STATES PATENT AND TRADEMARK OFFICE
CERTIFICATE OF CORRECTION

PATENT NO. : 10,602,183 B2  
APPLICATION NO. : 16/035545  
DATED : March 24, 2020  
INVENTOR(S) : Lars Lindberg et al.

Page 1 of 1

It is certified that error appears in the above-identified patent and that said Letters Patent is hereby corrected as shown below:

In the Claims

In Claim 16, at Column 16, Line 48: "separate (i) first sub-pixels into a first data stream, (ii)" should read -- separate (i) all first sub-pixels into a first data stream, (ii) --.

In Claim 16, at Column 16, Line 50: "(iii) third sub-pixels into a third data stream;" should read -- (iii) all third sub-pixels into a third data stream; --.

In Claim 17, at Column 17, Line 1: "the first data stream represents a luma data stream, second" should read -- the first data stream represents a luma data stream, the second --.

In Claim 18, at Column 17, Line 9: "wherein and" should read -- and --.

Signed and Sealed this  
Eleventh Day of January, 2022

Drew Hirshfeld  
*Performing the Functions and Duties of the*  
*Under Secretary of Commerce for Intellectual Property and*  
*Director of the United States Patent and Trademark Office*